(12) United States Patent
Ankireddi et al.

(10) Patent No.: US 8,796,052 B2
(45) Date of Patent: Aug. 5, 2014

(54) OPTOELECTRONIC APPARATUSES WITH POST-MOLDED REFLECTOR CUPS AND METHODS FOR MANUFACTURING THE SAME

(75) Inventors: Seshasayee S. Ankireddi, San Jose, CA (US); Lynn K. Wiese, Santa Clara, CA (US)

(73) Assignee: Intersil Americas LLC, Milpitas, CA (US)

( * ) Notice: Subject to any disclaimer, the term of this patent is extended or adjusted under 35 U.S.C. 154(b) by 193 days.

(21) Appl. No.: 13/460,594

(22) Filed: Apr. 30, 2012

(65) Prior Publication Data
US 2013/0221380 A1    Aug. 29, 2013

Related U.S. Application Data

(60) Provisional application No. 61/603,186, filed on Feb. 24, 2012.

(51) Int. Cl.
*H01L 21/00* (2006.01)
(52) U.S. Cl.
USPC ..................................... 438/28; 257/E21.504
(58) Field of Classification Search
USPC .......................................................... 438/25
See application file for complete search history.

(56) References Cited

U.S. PATENT DOCUMENTS

| | | | |
|---|---|---|---|
| 4,013,916 A | 3/1977 | Brown | |
| 6,003,676 A | 12/1999 | Beyer | |
| 6,682,331 B1 | 1/2004 | Peh et al. | |
| 7,727,817 B2 | 6/2010 | Xu et al. | |
| 7,833,811 B2 * | 11/2010 | Han et al. | 438/27 |
| 7,923,846 B2 * | 4/2011 | Do et al. | 257/777 |
| 2005/0073244 A1 | 4/2005 | Chou et al. | |
| 2006/0086943 A1 | 4/2006 | Wu et al. | |
| 2009/0072250 A1 | 3/2009 | Inoue | |
| 2010/0002444 A1 | 1/2010 | Konaka | |
| 2010/0188853 A1 | 7/2010 | Lee et al. | |
| 2010/0195308 A1 | 8/2010 | Lin | |
| 2011/0045618 A1 | 2/2011 | Kuhmann | |
| 2011/0057108 A1 | 3/2011 | Yao et al. | |
| 2011/0057129 A1 | 3/2011 | Yao et al. | |
| 2011/0079812 A1 | 4/2011 | Park | |
| 2011/0186897 A1 | 8/2011 | Loh | |

OTHER PUBLICATIONS

"Quad-flat no-leads package," Wikipedia, http://en.wikipedia.org/wiki/Quad-flat_no-leads_package, date unknown (accessed Mar. 27, 2012).

* cited by examiner

*Primary Examiner* — Chandra Chaudhari
(74) *Attorney, Agent, or Firm* — Vierra Magen Marcus LLP

(57) ABSTRACT

A method for manufacturing a plurality of optoelectronic apparatuses include attaching bottom surfaces of a plurality of packaged optoelectronic semiconductor devices (POSDs) to a carrier substrate (e.g., a tape) so that there is a space between each POSD and its one or more neighboring POSD (s). A light reflective molding compound is molded around a portion each of the POSDs attached to the carrier substrate so that a reflector cup is formed from the light reflective molding compound for each of the POSDs. The light reflective molding compound can also attach the POSDs to one another. Alternatively, an opaque molding compound can be molded around each POSD/reflector cup to attach the POSDs/reflector cups to one another and form a light barrier between each POSD and its neighboring POSD(s). The carrier substrate is thereafter removed so that electrical contacts on the bottom surfaces of the POSDs are exposed.

14 Claims, 9 Drawing Sheets

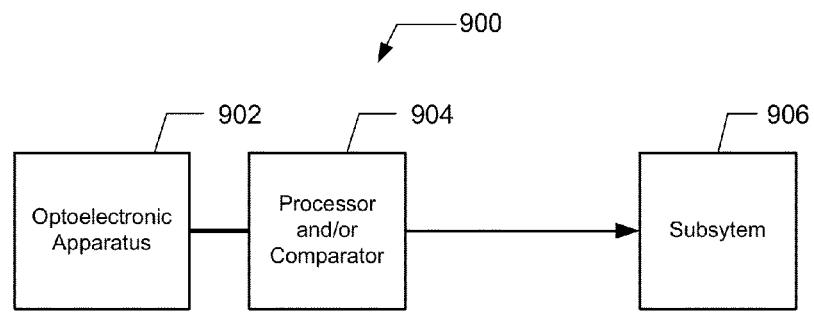
FIG. 9
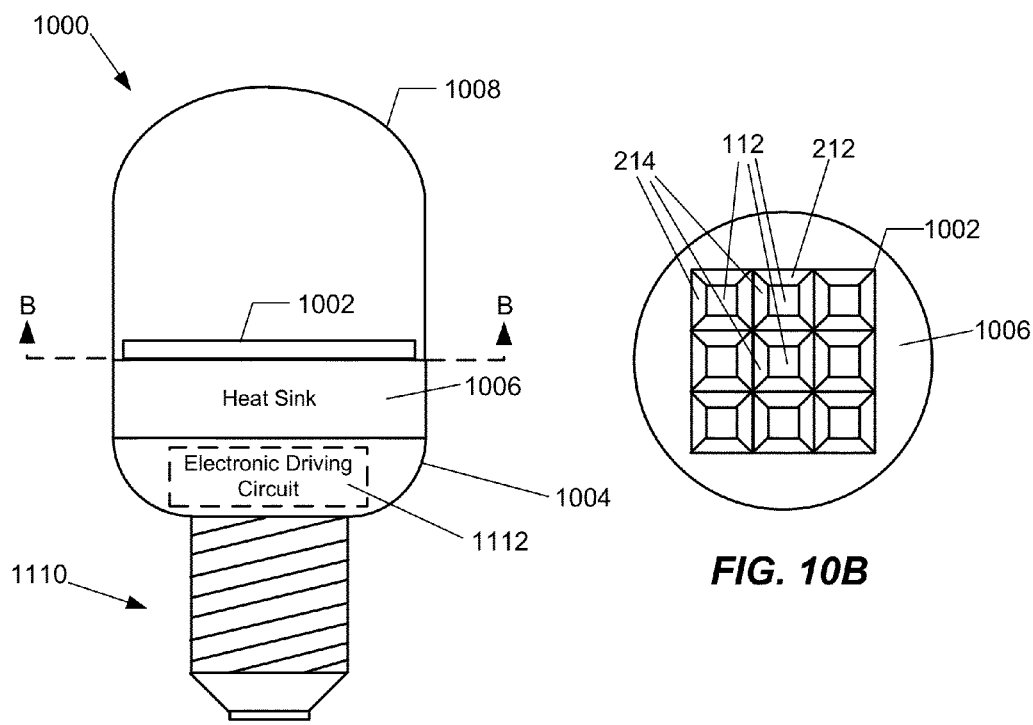
FIG. 10A
FIG. 10B

US 8,796,052 B2

OPTOELECTRONIC APPARATUSES WITH POST-MOLDED REFLECTOR CUPS AND METHODS FOR MANUFACTURING THE SAME

PRIORITY CLAIM

This application claims priority under 35 U.S.C. 119(e) to U.S. Provisional Patent Application No. 61/603,186, filed Feb. 24, 2012, which is incorporated herein by reference.

BACKGROUND

Since more and more optoelectronic apparatuses are being integrated into devices, such as mobile phones, there is a desire to provide smaller and cheaper optoelectronic apparatuses. Preferably, manufacturing of optical proximity sensors, as well as other optoelectronic apparatuses, should be relatively simple and should provide a high yield.

BRIEF DESCRIPTION OF THE DRAWINGS

FIG. 9 is a high level block diagram of a system according to an embodiment of the present invention.

FIG. 10A shows a side view of an LED light bulb according to an embodiment of the present invention.

FIG. 10B shows a sectional view of the LED light bulb of FIG. 10A.

DETAILED DESCRIPTION

Figure 1A:
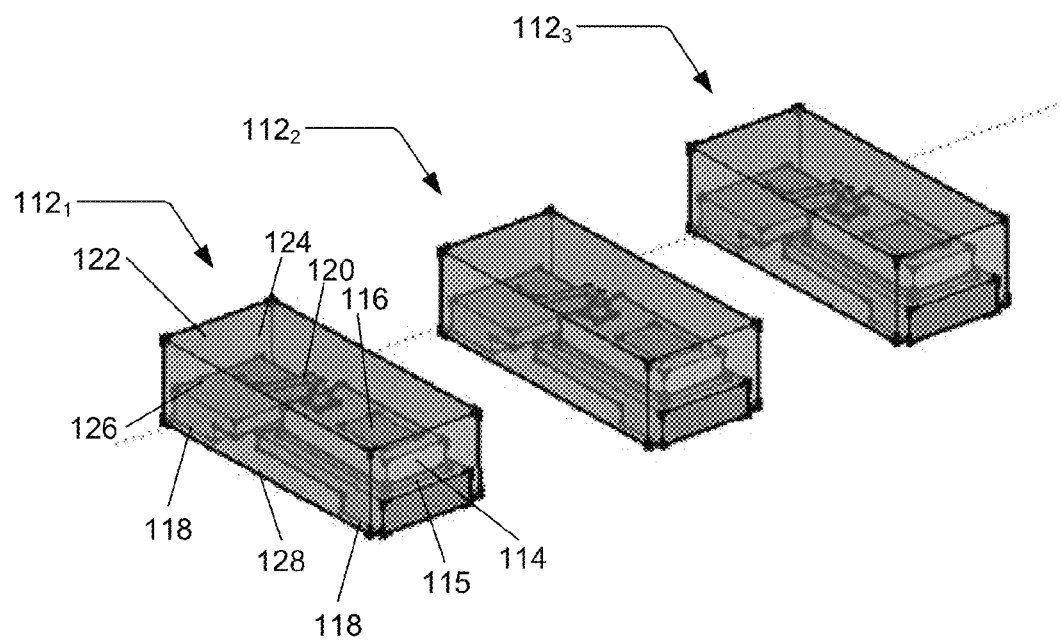
FIG. 1A shows a perspective view of three exemplary packaged light source semiconductor device (PLSSD).

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number identifies the drawing in which the reference number first appears.

Figure 1B:
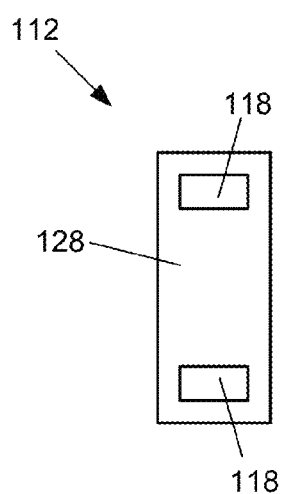
FIG. 1B shows a bottom view of one of the exemplary PLSSDs shown in FIG. 1A.

FIG. 1A shows a perspective view of three exemplary packaged light source semiconductor devices (PLSSDs) $112_1$, $112_2$ and $112_3$. Such devices can be referenced individually or collectively using reference 112. FIG. 1B shows a bottom view of one of the exemplary PLSSDs 112 shown in FIG. 1A. In this example, the bottom views of the three PLSSDs 112 are the same, and thus, only one need be shown in FIG. 1B. If the PLSSD 112 includes an integrated circuit, then it may alternatively be referred to as a packaged light source integrated circuit (PLSIC). More generically, the PLSSDs can be referred to as packaged optoelectronic semiconductor devices (POSDs). In accordance with an embodiment, a POSD is a device that includes one or electrical elements that emit and/or detect light and are encapsulated by a light transmissive molding compound, and includes electrical contacts that enable the electrical element(s) to be connected to electrical circuitry external to the device.

Each PLSSD 112 is shown as including a light source die 114 encapsulated within a light transmissive molding compound 122. The light source die 114 is shown as including one light emitting element 116, but can include more than one light emitting element 116. The light emitting element 116 can be a light emitting diode (LED), an organic LED (OLED), a bulk-emitting LED, a surface-emitting LED, a vertical-cavity surface-emitting laser (VCSEL), a superluminescent light emitting diode (SLED), a laser diode, or a pixel diode, but is not limited thereto. Light emitting elements, such as those mentioned above, are examples of optoelectronic elements.

The light transmissive molding compound 122 can be, e.g., a light transmissive epoxy (e.g., a clear or tinted epoxy), or other light transmissive resin or polymer. In certain embodiments, the light transmissive molding compound may have a pigment or other property that filters out light of certain wavelengths that are not of interest, while allowing light of wavelengths of interest to pass.

The light source die 114 is connected to electrical contacts 118 (which can alternatively be referred to as electrical connectors) by one or more die pads 115 below the die 114 and/or one or more bond wires 120. For example, one of the electrical contacts 118 can provide the contact for the anode(s) of the light emitting element(s) 116, while another one of the electrical contacts 118 can provide the contact for the cathode (s) of the light emitting element(s) 116. The light source die 114 can also include amplifier circuitry and/or other types of signal processing circuitry.

The PLSSD 112 includes a top surface 124, a bottom surface 128 and a peripheral surface 126 extending between the top surface 124 and the bottom surface 128. In this example, the top surface 124 of the PLSSD 112 is formed by a top surface of the light transmissive molding compound 122 (that encapsulates the light emitting element 116), and the peripheral surface 126 is formed by the four sides of the light transmissive molding compound 122. The bottom surface 128 includes the electrical contacts 118 for the light emitting element(s) 116, as best seen in FIG. 1B. The electrical contacts 118 can be, e.g., electrically conductive lands, electrically conductive pads, or electrically conductive balls, but are not limited thereto. For example, it is also possible that the electrical contacts 118 can be electrically conductive pins or wires. In this example, the PLSSD 112 includes two electrical contacts 118 on the bottom surface 128. In accordance with an embodiment, the PLSSD 112 is a flat no-leads package. In accordance with a specific embodiment, the electrical contacts 118 form a land grid array.

Figure 2A:
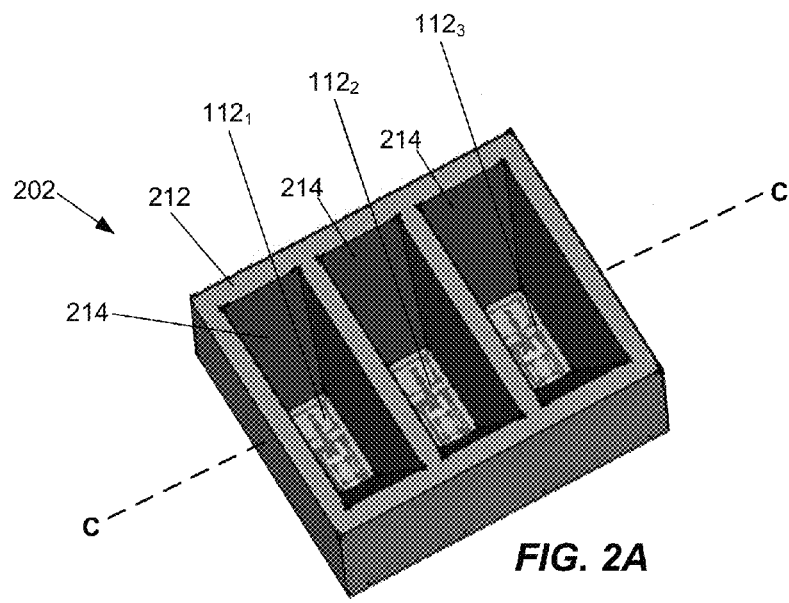
FIG. 2A is top perspective view of an optoelectronic apparatus according to an embodiment of the present invention.
Figure 2B:
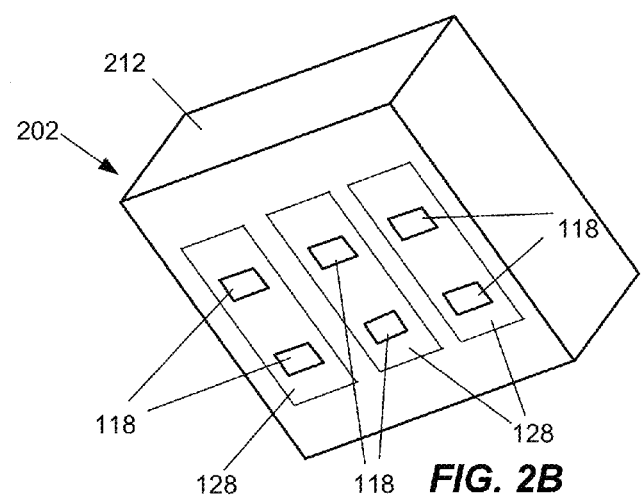
FIG. 2B is bottom perspective view of the optoelectronic apparatus of FIG. 2A.
Figure 2C:
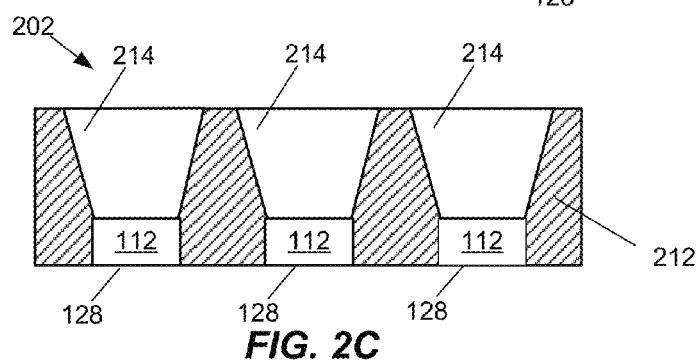
FIG. 2C is a cross section of the optoelectronic apparatus of FIGS. 2A and 2B.

Referring now to FIGS. 2A-2C, in accordance with an embodiment of the present invention, a light emitting optoelectronic apparatus 202 includes the three PLSSDs 112 (i.e., $112_1$, $112_2$ and $112_3$) and a light reflective molding compound 212. More specifically, FIG. 2A is top perspective view of the light emitting optoelectronic apparatus 202, and FIG. 2B is bottom perspective view of the light emitting optoelectronic apparatus 202. FIG. 2C is a cross section, along line C-C in FIG. 2A, of the light emitting optoelectronic apparatus 202.

As can be appreciated from FIGS. 2A-2C, the light reflective molding compound 212 surrounds and encapsulates the peripheral surfaces 126 of the PLSSDs 112. As can be best appreciated from FIGS. 2A and 2C, the light reflective molding compound 212 forms a reflector cup 214 for each PLSSD 112 that reflects light produced by the light emitting element(s) 116 of each PLSSD 112. Additionally, in this embodiment, the light reflective molding compound 212 physically attaches the three PLSSDs 112 to one another. Also shown in FIGS. 2A and 2C, is that each reflector cup 214 defines a window over the light emitting element(s) of each PLSSD 112. As can be appreciated from FIG. 2B, the electrical contacts 118 of the PLSSDs 112 are exposed, and thus, are accessible for electrical connections to other circuitry.

The light reflective molding compound 212 can be, e.g., a light reflective epoxy (e.g., a white, silver or other colored epoxy), or other light reflective resin or polymer. The epoxy, resin or polymer that is used as the light reflective molding compound should not be of a color, such as black, which primarily absorbs rather than reflects light.

While the reflectors cups 214 and widows defined therefrom are shown as having a specific shape and structure, the reflector cups 214 and windows defined therefrom can have a myriad of alternative shapes and structures while still being within the scope of an embodiment of the present invention.

Figure 3A:
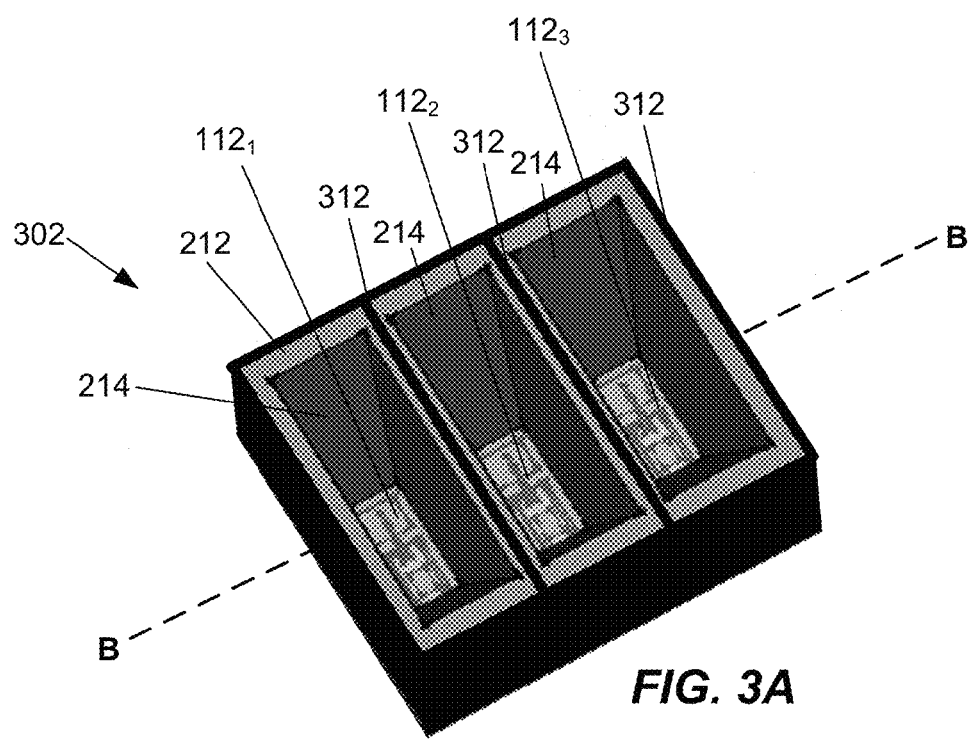
FIG. 3A is top perspective view of an optoelectronic apparatus according to another embodiment of the present invention.
Figure 3B:
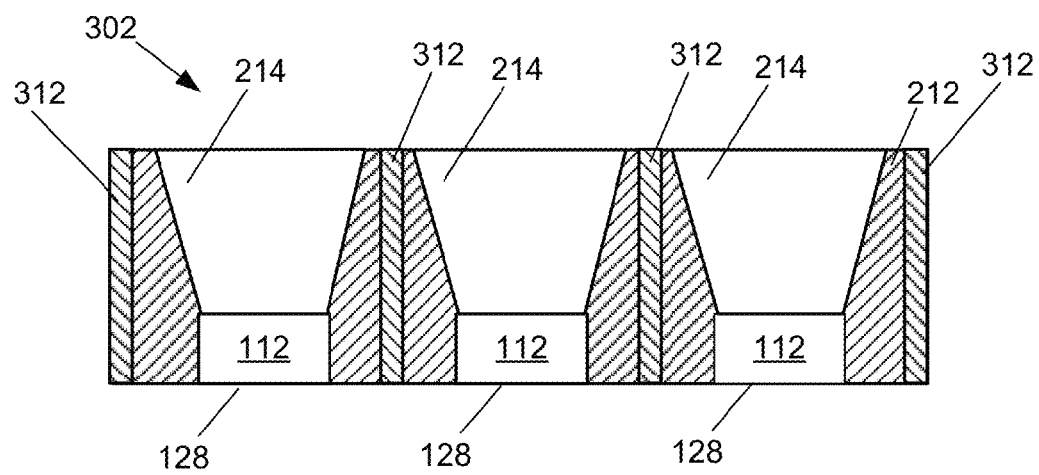
FIG. 3B is a cross section of the optoelectronic apparatus of FIG. 3A.

FIG. 3A is a perspective view of a light emitting optoelectronic apparatus 302 according to a further embodiment of the present invention. FIG. 3B is a cross-section, along line B-B in FIG. 3A, of the light emitting optoelectronic apparatus 302. The light emitting optoelectronic apparatus 302 is similar to the light emitting optoelectronic apparatus 202, in that they both include a plurality of PLSSDs 112, each having a corresponding reflector cup 214 formed from the light reflective molding compound 212, with the electrical contacts 118 on the bottom surfaces of the PLSSDs 112 exposed. However, a distinction between the light emitting optoelectronic apparatus 302 and the light emitting optoelectronic apparatus 202, is that the light emitting optoelectronic apparatus 302 includes a light barrier formed from an opaque molding compound 312 between each PLSSD 112 and its neighboring PLSSD(s) 112. In FIGS. 3A and 3B, the opaque molding compound 312 also forms a barrier around the entire periphery of the apparatus 302, so as to optically isolate the apparatus 302 from one or more other optoelectronic apparatus(es) that may be located in the vicinity of the apparatus 302. The opaque molding compound 312 can be, e.g., a black or other dark epoxy, or other resin or polymer that is non-transmissive to the light generated by the PLSSDs 112.

The light barriers formed from the opaque molding compound 312, which optically isolate the PLSSDs 112 from one another, are especially useful where only some (but not all) of the PLSSDs 112 of a light emitting optoelectronic apparatus (e.g., a seven-segment display) are selectively driven to emit light at certain times. This is because without the light barriers, light emitted by one PLSSD 112 can penetrate through the light reflective molding compound 212 and make it appear that a neighboring PLSSD 112 is emitting light. However, where all the PLSSDs 112 of the light emitting optoelectronic apparatus (e.g., 202) are going to be turned on or off at the same time, e.g., where the light emitting optoelectronic apparatus is used for lighting (e.g., backlighting, or to make an LED type of a light bulb), then the light barriers are not necessary, but can be included if desired.

Figure 4A:
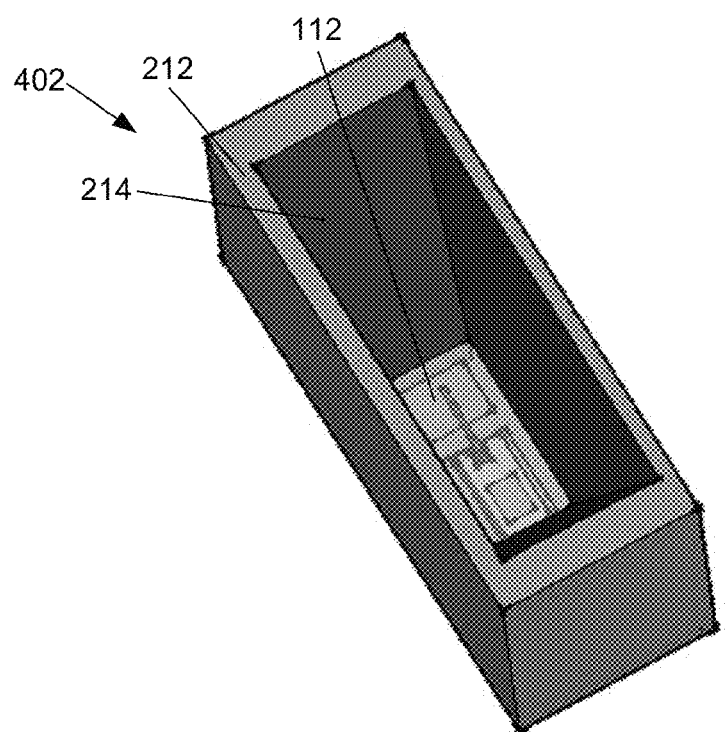
FIG. 4A shows a top perspective view of an optoelectronic apparatus according to a further embodiment of the present invention.
Figure 4B:
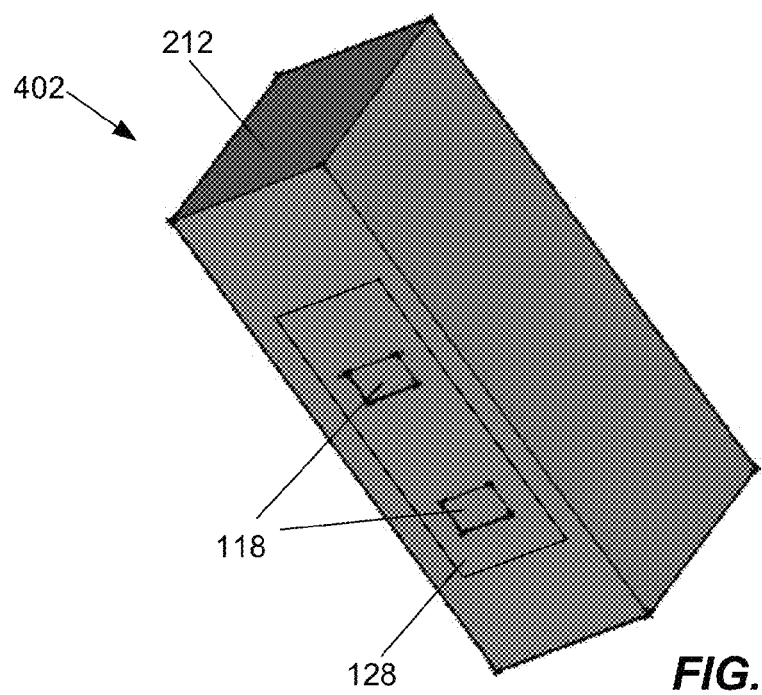
FIG. 4B is bottom perspective view of the optoelectronic apparatus of FIG. 4A.

The light emitting optoelectronic apparatuses 202 and 302 were shown as including an array of three PLSSDs 112 (i.e., a 1×3 array). In accordance with alternative embodiments, a light emitting optoelectronic apparatus can include other numbers of PLSSDs, which can be configured in alternative patterns. For example, FIGS. 4A and 4B are, respectively, top and bottom perspective views of a light emitting optoelectronic apparatus 402 including a single PLSSD 112 and a single reflector cup 214 formed from the light reflective molding compound 212. For another example, a light emitting optoelectronic apparatus, according to an embodiment of the present invention, can include an array of 133 M PLSSDs 112, where M is any integer greater than or equal to two. For still another example, a light emitting optoelectronic apparatus, according to an embodiment of the present invention, can include a matrix of N×M PLSSDs 112, where N and M are each integers greater than or equal to two, which may or may not be equal to one another. In other words, a light emitting optoelectronic apparatus can include N rows by M columns of the PLSSDs 112 (or more generally, of POSDs). A myriad of other arrangements are also possible. For example, a plurality of the PLSSDs 112 can be arranged to form an seven-segment (or other number-segment) display that enables alpha-numeric symbols to be illuminated and thereby displayed. For still another example, a plurality of the PLSSDs 112 can be arranged to form a filled-in circle, with the resulting light emitting optoelectronic apparatus being used to produce an LED type of light bulb. These are just a few examples, which are not meant to be all encompassing. In each such embodiment, a reflector cup 214 is formed from the light reflective molding compound 212 for each of the PLSSDs 112 (or more generally, for each of the POSDs).

A useful feature of an optoelectronic apparatuses, according to specific embodiments of the present invention, is that they include reflector cups manufactured in an efficient and cost effective manner. A useful feature of optoelectronic apparatuses that each include two or more POSDs, according to specific embodiments of the present invention, is that the multiple POSDs are physically attached to one another without the need for a substrate (e.g., a PCB) that is at least partially dedicated to providing such attachment. A benefit of this feature is that it can reduce the total height, volume and weight of the resulting optoelectronic apparatus, and can reduce the cost of manufacturing the optoelectronic apparatuses. In embodiments where light barriers (formed from the opaque molding compound 312) are not included, the same light reflective molding compound that is used to form reflector cups is also used to physically attach multiple POSDs to one another. In embodiments where light barriers (formed from the opaque molding compound 312) are included, the same opaque molding compound that is used to form the light barriers is also used to physically attach multiple POSDs and reflector cups to one another. These features can also reduce the total height, volume and weight of the resulting optoelectronic apparatus, and can reduce the cost of manufacturing the optoelectronic apparatuses.

In the embodiments described above, each of the POSDs used to produce an optoelectronic apparatus was generally described as the type that emits light, e.g., as a PLSSD 112. In other words, the optoelectronic apparatuses described above were generally light emitting types of optoelectronic apparatuses. However, embodiments of the present invention are not limited thereto. For example, other types of POSDs can benefit from the addition of a reflector cup formed of a light reflective molding compound. For a specific example, a packaged light detection semiconductor device (PLDSD) that is to be used as an ambient light detector may capture more light, and thus be more sensitive, if it were provided with such a reflector cup. Accordingly, embodiments of the present invention are also directed to optoelectronic apparatuses that include one or more PLDSDs. A single PLDSD having a reflector cup added, in accordance with an embodiment of the present invention, can be used as an ambient light sensor, e.g., for use in adjusting backlighting, or the like. An optoelectronic apparatuses according to further embodiments can include one or more PLSSDs (e.g., 112) as well as one or more PLDSDs. In such apparatuses, the PLDSD(s) can function as an ambient light sensor that is used to adjust the intensity of the light emitted by the PLSSD(s). Alternatively, apparatuses including both PLSSD(s) and PLDSD(s) can be used for proximity detection and/or gesture recognition and/or ambient light detection. Where an optoelectronic apparatus includes at least one PLSSD and at least one PLDSD, it is beneficial and within the scope of the present invention to form a light barrier from the opaque molding compound 312 between each PLSSD and each PLDSD, so that light is not transmitted directly from a PLSSD to a PLDSD. An exemplary PLDSD, which can be included in optoelectronic apparatuses according to specific embodiments of the present invention, shall now be described with reference to FIGS. 5A and 5B.

Figure 5A:
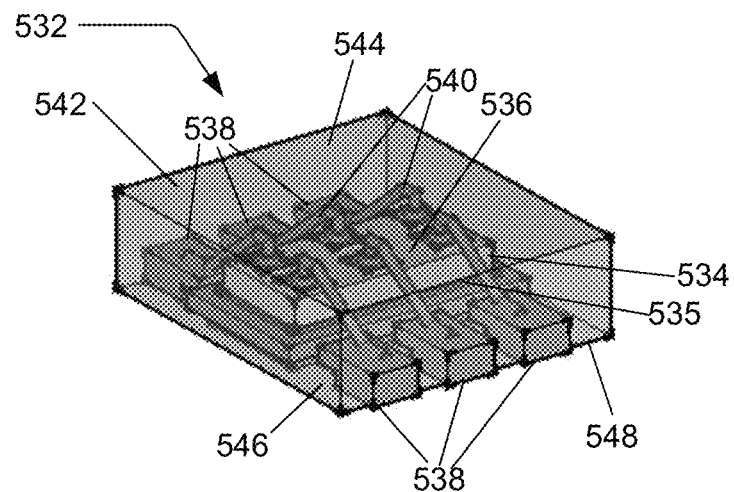
FIG. 5A shows a perspective view of an exemplary packaged light detector semiconductor device (PLDSD).
Figure 5B:
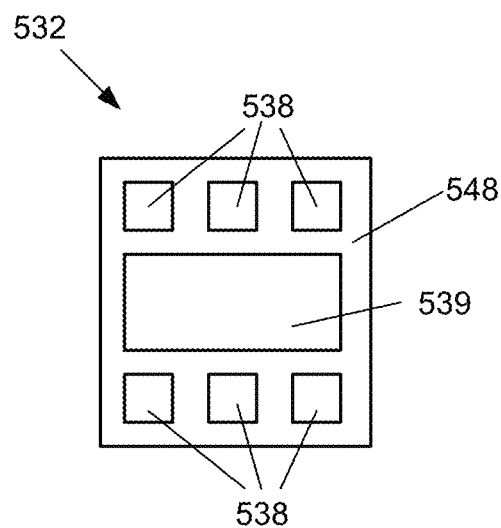
FIG. 5B shows a bottom view of the exemplary PLDSD shown in FIG. 5A.

FIG. 5A shows a perspective view of an exemplary packaged light detector semiconductor device (PLDSD) 532. FIG. 5B shows a bottom view of the exemplary PLDSD 532 shown in FIG. 5A. Referring to FIG. 5A, the PLDSD 532 is shown as including a light detector die 534 encapsulated within a light transmissive molding compound 542. The light detector die 534 is shown as including one light detecting element 536, but can include more than one light detecting element 536. The light detecting element 536 can be a photoresistor, a photovoltaic cell, a photodiode, a phototransistor, or a charge-coupled device (CCD), but is not limited thereto, and preferably can be used to produce a current or voltage indicative of the magnitude and/or phase of detected light. Light detecting elements, such as those mentioned above, are also examples of optoelectronic elements.

The light transmissive molding compound 542 can be, e.g., a light transmissive epoxy (e.g., a clear or tinted epoxy), or other light transmissive resin or polymer. In certain embodiments, the light transmissive molding compound may have a pigment or other property that filters out light of certain wavelengths that are not of interest, while allowing light of wavelengths of interest to pass. The light transmissive molding compound 542 of the PLDSD 532 can be the same as, or different than, the light transmissive molding compound 122 of the PLSSD 112.

The light detector die 534 is connected to electrical contacts 538 (which can alternatively be referred to as electrical connectors) by one or more die pads 535 below the die 534 and/or one or more bond wires 540. For example, one or more of the electrical contacts 538 can provide the contact for the anode(s) of the light detecting element(s) 536, while one or more further electrical contacts 538 can provide the contact for the cathode(s) of the light detecting element(s) 536. The light detector die 534 can also include amplifier circuitry, filter circuitry and/or other types of signal processing circuitry.

The PLDSD 532 includes a top surface 544, a bottom surface 548 and a peripheral surface 546 extending between the top surface 544 and the bottom surface 548. In this example, the top surface 544 of the PLDSD 532 is formed by a top surface of the light transmissive molding compound 542 (that encapsulates the light detecting element 536), and the peripheral surface 546 is formed by the four sides of the light transmissive molding compound 542. The bottom surface includes the electrical contacts 538 for the light detecting element(s) 536, as best seen in FIG. 5B. The electrical contacts 538 can be, e.g., electrically conductive lands, electrically conductive pads, or electrically conductive balls, but are not limited thereto. For example, it is also possible that the electrical contacts 538 can be electrically conductive pins or wires. In this example, the PLDSD 512 includes six electrical contacts 538 and an exposed thermal pad 539 on the bottom surface 548. The exposed pad 539 can alternatively, or additionally, be a ground plane for the PLDSD 532. In accordance with an embodiment, the PLDSD 532 is a flat no-leads package. In accordance with a specific embodiment, the electrical contacts 538 form a land grid array.

Optoelectronic apparatuses of embodiments of the present invention can include alternative numbers of POSDs than shown in the figures discussed above, while still being within the scope of an embodiment of the present invention. It is also within the scope of an embodiment of the present invention that one or more POSDs of an optoelectronic apparatus differs from the PLSSD 212 and the PLDSD 512 described above.

Embodiments of the present are also directed to methods for manufacturing optoelectronic apparatuses, including, the apparatuses 202, 302 and 402 described above, as well as other types of optoelectronic apparatuses. Such manufacturing methods shall now be explained with reference to FIGS. 6A-6E.

Figure 6A:
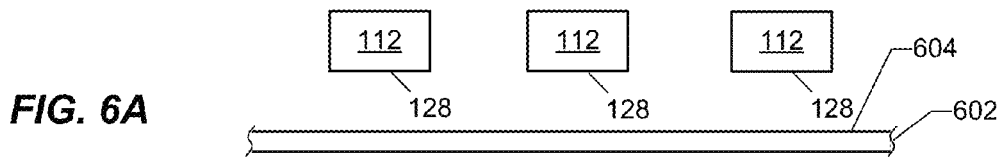
FIGS. 6A-6E are used to describe methods for manufacturing optoelectronic apparatuses according to certain embodiments of the present invention.

FIG. 6A shows three the PLSSDs 112 above a carrier substrate 602. As explained above, each PLSSD 112 (or other POSD) includes a top surface, a bottom surface and a peripheral surface extending between the top and bottom surfaces. As also explained above, each PLSSD 112 (or other POSD) includes electrical contacts on its bottom surface. In accordance with an embodiment, the PLSSD 112 and and/or other types of POSDs, are tested prior to be attached to the carrier substrate 602.

The carrier substrate 602, in accordance with an embodiment, is a tape having an adhesive surface 604. The carrier substrate 602 can alternatively be a film or foil having an adhesive surface. Since, as explained herein, one or more molding compounds (212 and potentially 312) will be molded around the PLSSDs 112 attached to the tape (or other carrier substrate), the tape (or other carrier substrate) should be able to withstand the high temperatures of the molten molding compound without melting or otherwise being damaged. For example, the tape can be made from polyimide (PI), polyvinylchloride (PVC), or can be a polyolefin-based material, but is not limited thereto. Exemplary polyimide tapes and films are made by DuPont (headquartered in Wilmington, Del., USA) and marketed under the trademark Kapton™. Alternatively, the carrier substrate 302 can be some other type of removable substrate having an adhesive surface. The adhesive can be a silicon based adhesive, but is not limited thereto.

Figure 6B:
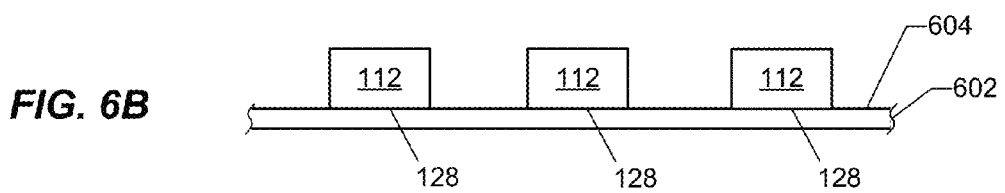

FIG. 6B shows that the bottom surfaces of the PLSSDs 112 are attached to the carrier substrate 602 so that there is a space between each PLSSD 112 and its neighboring PLSSD(s) 112. While only three PLSSDs 112 are shown in FIG. 3B, most likely dozens and potentially hundreds of such PLSSDs and/or other POSDs are attached to the same carrier substrate 602. For example, N columns×M rows (e.g., 15×20) of such groups (which can also be referred to as subsets) can be attached to a same carrier substrate (e.g., tape) such that N×M apparatuses (e.g., 15×20=300 apparatuses) can be manufactured at the same time, where N and M are each integers that are greater than or equal to one, and N and M can be the same or different from one another. As described above, alternatively other numbers (e.g., 1, 2, 4, 5 . . . ) of packaged optoelectronic semiconductor devices can be included in each apparatus.

While not as practical, it is possible that the carrier substrate 602 does not have an adhesive surface, in which case the bottom surfaces of the PLSSDs 112 and/or other POSDs (e.g., the PLDSDs 532) can be attached to the carrier substrate 602 using an adhesive that is dispensed directly onto the PLSSDs 112 and/or other POSDs and/or the carrier substrate 602.

Figure 6C:
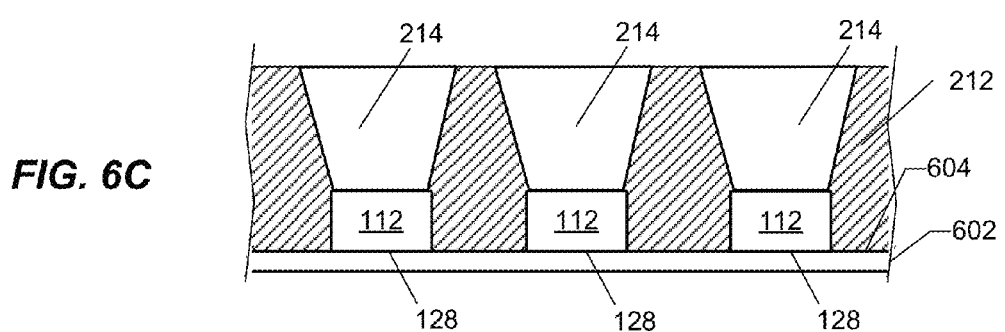

FIG. 6C shows that the light reflective molding compound 212 is molded around portions of the PLSSDs 112 attached to the carrier substrate 602, so that the peripheral surfaces of the PLSSDs 112 are surrounded by the light reflective molding compound 212, and a reflector cup 214 is formed from the opaque molding compound 212 for each of the PLSSDs 112. FIG. 6C also shows that the spaces between the PLSSDs 112 are filled with the light reflective molding compound 212, which attached the PLSSDs to one another. As mentioned above, while only three PLSSDs are shown in FIG. 6C, the above described molding is most likely being simultaneously performed for dozens and potentially hundreds of such subsets of PLSSDs (and/or other POSDs) all attached to the same carrier substrate 602. The mold that is used to perform the molding using the light reflective molding compound 212 can be coated with a material, such as Teflon™ or silicon rubber, to enable the resulting overmolded structure to be more easily removed from the mold. Molding techniques that can be used include, but are not limited to, injection molding, compression molding, transfer molding and cast molding.

Figure 6D:
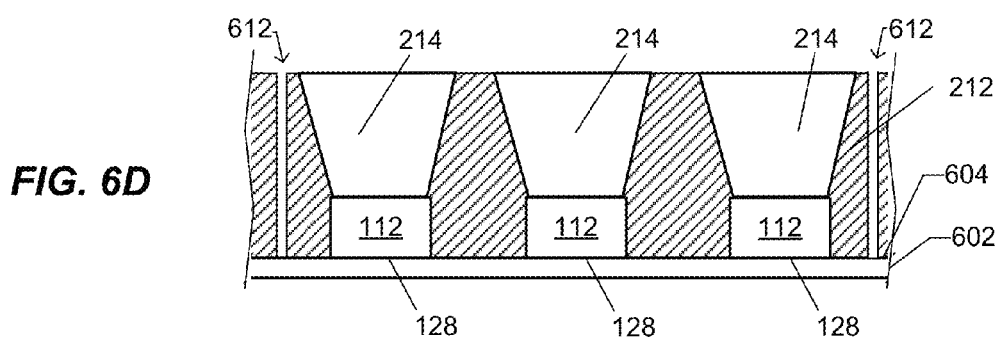

FIG. 6D shows that the light reflective molding compound 212 is cut through at 612 (where 612 can also be referred to as a cut) to separate the subset of three PLSSDs 112 from other subsets of PLSSDs 112, so that a resulting optoelectronic apparatus includes the three PLSSDs 112 each including a respective reflector cup 214 and all of which are attached to one another by the light reflective molding compound 212. Such cutting can be performed using a saw, blade or laser, but is not limited thereto. In accordance with an embodiment, the cutting is performed such that the light reflective molding compound 212 is cut through, without cutting through the carrier substrate 602, as shown in FIG. 6D. Alternatively, the cutting can be performed such that the light reflective molding compound 212 and the carrier substrate 602 are both cut through.

Figure 6E:
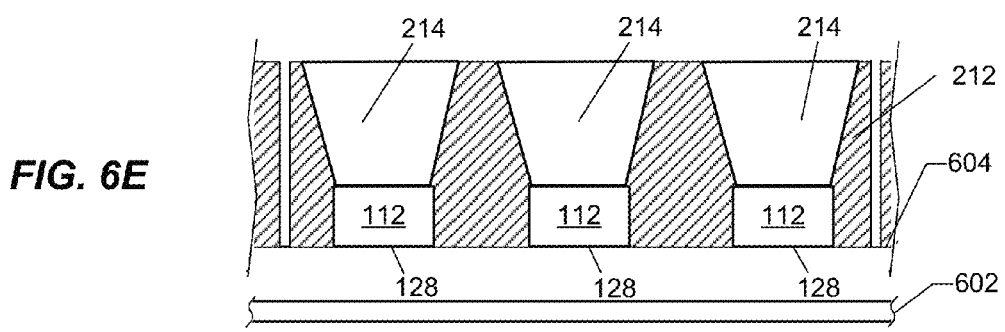

FIG. 6E shows that the carrier substrate 602 is removed. This exposes the electrical contacts 118 (shown in FIG. 1B) on the bottom surface 128 of the PLSSD 112s and/or on the bottom surfaces of other POSDs. The carrier substrate 602 (e.g., tape) can be removed by simply pealing it off, using a solvent to remove the adhesive, or through use of vibration or the like, but is not limited thereto. In an alternative embodiment, the carrier substrate 602 is removed prior to the cutting described above. In accordance with an embodiment, the resulting optoelectronic apparatus(es) (e.g., 202) is/are tested before or after the cutting, but most likely after the carrier substrate is removed, so that the electrical contacts can be more readily accessed during the testing.

The molding can alternatively be performed such that PLSSDs 112 are covered by the light reflective molding compound 212. Thereafter, portions of the light reflective molding compound 212 covering the one or more light emitting elements of each PLSSD 112 can be removed to form a light reflector cup 214 and window for each of the PLSSDs 112. The removing to form the reflector cups and windows can be by etching, developing, stripping or some other technique. These steps can be performed in place of the step described with reference to FIG. 6C.

As was described above with reference to FIGS. 3A and 3B, an opaque molding compound may also be used to form light barriers between neighboring PLSSDs 112 and/or other types of POSDs (e.g., PLDSDs 532). Such embodiments can be accomplished using a two separate molding steps. For example, first the light reflective molding compound 212 can be molded around portions of the PLSSDs 112 (and/or other POSDs) attached to the carrier substrate 602, so that the peripheral surfaces of the PLSSDs 112 are surrounded by the light reflective molding compound 212, and a reflector cup 214 is formed from the opaque molding compound 212 for each of the PLSSDs 112 (and/or other POSDs). In this embodiment, spaces are left between each PLSSD 112 and corresponding reflector cup 214 and its neighboring PLSSD (s) 112 and corresponding reflector cup 214. The spaces are thereafter filled with the opaque molding compound 312 in a second molding step. The opaque molding compound 312 forms light barriers between neighboring PLSSDs (and/or other POSDs) and attaches neighboring PLSSDs (and/or other POSDs) and reflector cups to one another.

In an alternative embodiment, the steps described with reference to FIGS. 6A-6C are performed. Thereafter, a cut is formed between each PLSSD 112 (and/or other POSD) and its neighboring PLSSD(s) 112 (and/or other POSD(s)), or just between selected adjacent POSDs. Those cuts are then filled with the opaque molding compound 312 to form the aforementioned light barriers. The steps described with reference to FIGS. 6D and 6E are then performed.

Figure 7:
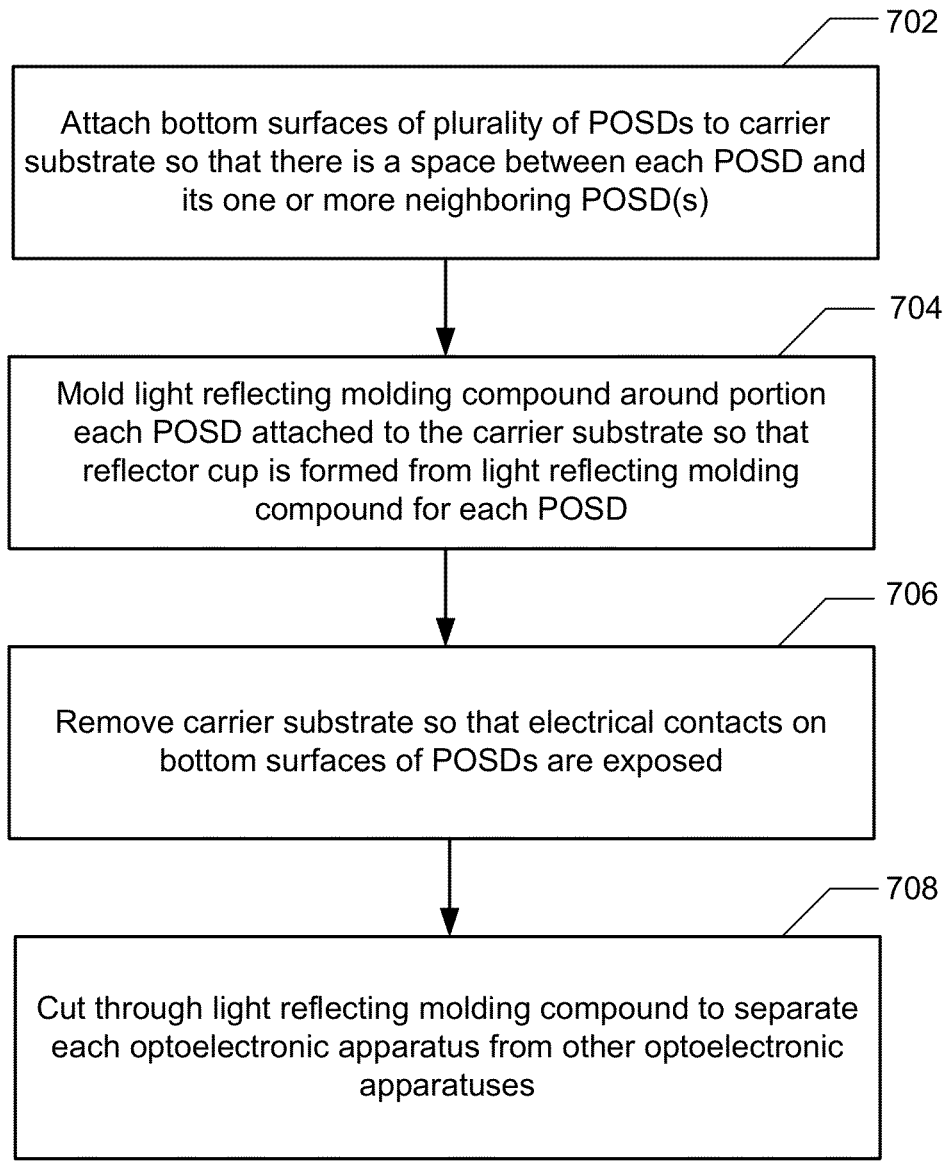
FIG. 7 is a high level flow diagram that is used to summarize methods for manufacturing multiple optoelectronic apparatus simultaneously, according to various embodiments of the present invention.

FIG. 7 is a high level flow diagram that is used to summarize methods for manufacturing a plurality of optoelectronic apparatuses, according to various embodiments of the present invention. For the following description, it will be assumed that each optoelectronic apparatus includes one or more packaged optoelectronic semiconductor devices (POSDs). As was described above, each POSD includes a top surface, a bottom surface and a peripheral surface extending between the top and bottom surfaces. Additionally, each POSD includes one or more optoelectronic elements encapsulated by a light transmissive molding compound. Further, each POSD includes electrical contacts on its bottom surface.

Referring to FIG. 7, at step 702, the bottom surfaces of a plurality of POSDs are attached to a carrier substrate (e.g., a tape having an adhesive surface) so that there is a space between each POSD and its one or more neighboring POSD (s).

At step 704, a light reflective molding compound is molded around a portion each of the POSDs attached to the carrier substrate so that a reflector cup is formed from the light reflective molding compound for each of the POSDs. In accordance with specific embodiments, as a result of step 704, the peripheral surface of each of the POSDs is surrounded by the light reflective molding compound which forms the reflector cups for the POSDs, the space between each of the POSDs and its one or more neighboring POSD(s) is filled with the light reflective molding compound, and the plurality of POSDs are attached to one another by the reflective molding compound.

At step 706, the carrier substrate (e.g., tape) is removed so that the electrical contacts on the bottom surfaces of the POSDs are exposed. As mentioned above, the carrier substrate can be removed by pealing it off, using a solvent, or using vibration, but is not limited thereto.

At step 708, the light reflective molding compound is cut through to separate each of the optoelectronic apparatuses from other optoelectronic apparatuses. In an alternative embodiment, the order of steps 706 and 708 are reversed. As explained above, each optoelectronic apparatus being manufacture can include a single POSD, or multiple POSDs. As also explained above, each of the POSDs can be, e.g., a packaged light source semiconductor device (PLSSD) that includes one or more light emitting elements. It is also possible that at least one of the POSDs comprises a packaged light detector semiconductor device (PLDSD) that include one or more light detecting elements.

In certain embodiments, step 708 involves cutting through the light reflective molding compound to separate each of the POSDs from the other POSDs, so that each of a plurality of resulting optoelectronic apparatuses includes one of the POSDs and one of the reflector cups formed from the light reflective molding compound.

In other embodiments, step 708 involves cutting through the light reflective molding compound to separate subsets of the POSDs from the other subsets of the POSDs, so that each of a plurality of resulting optoelectronic apparatuses includes one subset of the POSDs, with each subset of the POSDs including at least two POSDs. In such embodiments, associated with each of the POSDs within each subset of the POSDs is a corresponding one of the reflector cups formed from the light reflective molding compound.

Where there is a desire to prevent light leaking between adjacent POSDs of the same optoelectronic apparatus, after step 704, but before step 706, an opaque molding compound can be molded around a portion of each (or at least some) of the molded reflector cups so that an optical barrier is formed from the opaque molding compound between each (or at least some) of the POSDs and one or more neighboring POSD(s).

Figure 8:
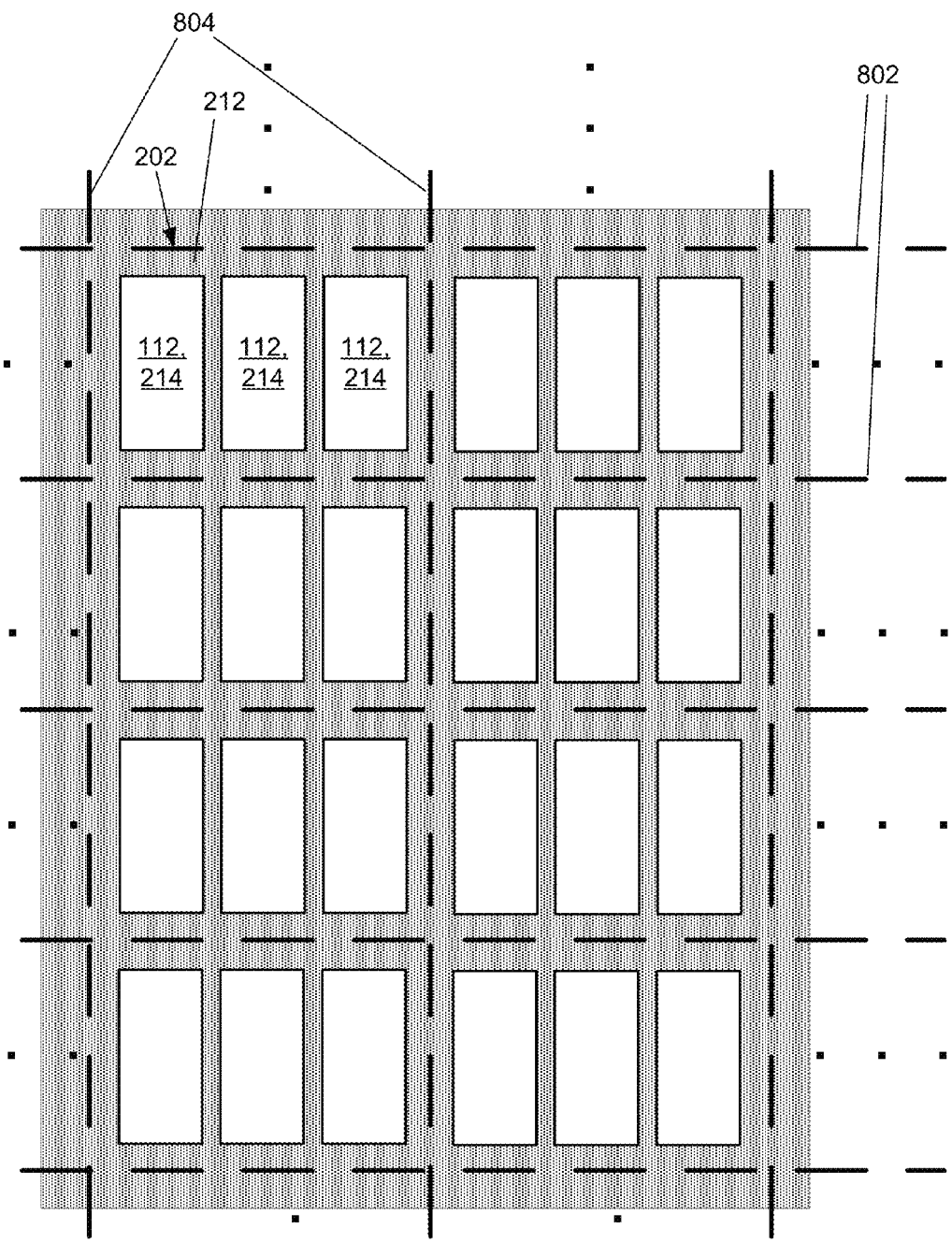
FIG. 8 illustrates how a plurality of the sets of the packaged optoelectronic semiconductor devices (POSDs) can be used to manufacture a plurality of optoelectronic apparatus, in accordance with various embodiments of the present invention.

FIG. 8, illustrates an exemplary top view of a plurality of the sets of the POSDs, which each set of POSDs including three packaged light source semiconductor devices (PLSSDs) 112. The light reflective molding compound 212 is molded around portions of each of the POSDs (attached to the carrier substrate 602), so that a reflector cup 214 is formed from the light reflective molding 212 compound for each of the POSDs. In this example, the peripheral surface of each of the POSDs is surrounded by the light reflective molding compound 212 (which forms the reflector cups for the POSDs), the space between each of the POSDs and its one or more neighboring POSD(s) is filled with the light reflective molding compound 212, and the plurality of POSDs are attached to one another by the reflective molding compound 212.

By cutting along horizontal dashed lines 802 and vertical dashed lines 804, the result is plurality of separated optoelectronic apparatuses that each includes a set of the POSDs (three PLSSDs in this example). As mentioned above, such cutting can be performed using a saw, blade or laser, but is not limited thereto. The cutting can be performed before or after the carrier substrate (e.g., 602) is removed. Where the cutting is performed before the carrier substrate is removed, the cutting can be performed such that the light reflective molding compound 212 is cut through, without cutting through the carrier substrate. Alternatively, the cutting can be performed such that the light reflective molding compound 212 and the carrier substrate are both cut through. More generally, the POSDs can be separated by sawing or another method, into individual subassemblies, or groups of subassemblies, to yield a final product.

FIG. 9 is a high level block diagram of a larger system that includes an optoelectronic apparatus according to an embodiment of the present invention. Optoelectronic systems of embodiments of the present invention can be used in various larger systems, including, but not limited to, cell-phones, handheld-devices, televisions, computer systems and/or portions thereof (e.g., computer display monitors).

Referring to the system 900 of FIG. 9, for example, an optoelectronic apparatus 902 of an embodiment can be used to control whether a subsystem 906 (e.g., display screen, touch-screen, backlight, virtual scroll wheel, virtual keypad, navigation pad, etc.) is enabled or disabled, and/or the brightness of the subsystem. For example, wherein the optoelectronic apparatus 902 is, or includes, a proximity sensor, it can detect when an object, such as a person's finger, is approaching, and based on the detection either enable (or disable) a subsystem 906. Additionally, wherein the optoelectronic apparatus 902 is, or includes, an ambient light sensor, its output can be used to adjust a brightness of the subsystem 906 where appropriate. For example, one or more output of the optoelectronic apparatus 902 can be provided to a comparator and/or processor 904 which can, e.g., compare the output(s) of the optoelectronic apparatus 902 to one or more threshold, to determine whether an object is within a range where the subsystem 906 should be enabled (or disabled, depending on what is desired). Multiple thresholds can be used, and more than one possible response can occur based on the detected proximity of an object. For example, a first response can occur if an object is within a first proximity range, and a second response can occur if the object is within a second proximity range. It is also possible that functionality of the comparator and/or processor 904, or portions thereof, be included within the optoelectronic apparatus 902.

FIG. 10A illustrates an LED lamp system 1000, according to an embodiment of the present invention, which includes an optoelectronic apparatus 1002. The LED lamp system 1000, which can also be referred to as an LED light bulb, is also shown as including a housing 1004, a heat sink 1006, a globe 1008, an electrical connector 1110 and electronic driving circuitry 1112. The housing 1004 can be made of a resin and/or metal. The globe 1008 can be made of a light transmissive material, such as glass or an opaque resin. The heat sink 1006 can be made of a resin and/or metal and is used to dissipate heat generated by the light emitting elements (e.g., LEDs) of the optoelectronic apparatus 1002, and potentially heat generated by the driving circuitry 1112. The electronic connector 1110 is used to connect the LED lamp 1000 to a lamp socket (not shown), which can have various different structural configurations. The electronic drive circuitry 1112 is used to produce electrical current and/or voltage signals for driving the LEDs of the optoelectronic apparatus 1002 based on power received from an external power source, such as, but not limited to, an AC power source, or a DC power source (e.g., one or more batteries). FIG. 10B is a sectional view along line B-B in FIG. 10A. Referring to FIG. 10B, the optoelectronic apparatus 1002 is shown as having nine PLSSDs 112, with each PLSSD 112 having a corresponding reflector cup 214. Each PLSSD 112 includes one or more light emitting elements (e.g., LEDs) encapsulated by a light transmissive molding compound, with exposed electrical contacts on the bottom surface of each PLSSD 112. The light reflective molding compound 212 surrounds and forms the reflector cup 214 for each of the PLSSD 112s and connects the PLSSDs 112 to one another. The electrical contacts (e.g., 118 in FIG. 1B) receive electrical signals from the electronic driving circuit 1112 for driving the light emitting elements (e.g., LEDs) of the PLSSDs 112, which cause the lamp 1000 to emit light. More or less PLSSDs 112 than shown can be included in the optoelectronic apparatus 1002 of the lamp 1000. Additionally, the PLSSDs 112 can be arranged relative to one another in a different manner than shown in FIG. 10B.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A method for manufacturing a plurality of optoelectronic apparatuses that each include one or more packaged optoelectronic semiconductor devices (POSDs),
    wherein each POSD includes one or more optoelectronic elements encapsulated by a light transmissive molding compound, and
    wherein each POSD includes a bottom surface including electrical contacts,
    the method comprising:
    (a) attaching the bottom surfaces of a plurality of POSDs to a carrier substrate so that there is a space between each POSD and its one or more neighboring POSD(s);
    (b) molding a light reflective molding compound around a portion each of the POSDs attached to the carrier substrate so that a reflector cup is formed from the light reflective molding compound for each of the POSDs; and
    (c) removing the carrier substrate so that the electrical contacts on the bottom surfaces of the POSDs are exposed.

2. The method of claim 1, wherein step (b) includes molding the light reflective molding compound around a portion of each of the POSDs attached to the carrier substrate so that
    a peripheral surface of each of the POSDs is surrounded by the light reflective molding compound which forms the reflector cups for the POSDs,
    the space between each of the POSDs and its one or more neighboring POSD(s) is filled with the light reflective molding compound, and
    the plurality of POSDs are attached to one another by the reflective molding compound.

3. The method of claim 2, further comprising, after step (b), and either before or after step (c):
    cutting through the light reflective molding compound to separate each of the POSDs from the other POSDs, so that each of a plurality of resulting optoelectronic apparatuses includes one of the POSDs and one of the reflector cups formed from the light reflective molding compound.

4. The method of claim 2, further comprising, after step (b), and either before or after step (c):
    cutting through the light reflective molding compound to separate subsets of the POSDs from the other subsets of the POSDs, so that each of a plurality of resulting optoelectronic apparatuses includes one subset of the POSDs;
    wherein each subset of the POSDs comprises at least two POSDs; and
    wherein associated with each of the POSDs within each subset of the POSDs is a corresponding one of the reflector cups formed from the light reflective molding compound.

5. The method of claim 1, further comprising after step (b) and before step (c):
    molding an opaque molding compound around a portion of each of the molded reflector cups so that an optical barrier is formed from the opaque molding compound between each of the POSDs and its one or more neighboring POSDs.

6. The method of claim 5, further comprising, after the molding the light reflective molding compound, after the molding the opaque molding compound, and either before or after step (c):
    cutting through the opaque molding compound to separate one of the POSDs from other ones of the POSDs, so that a plurality of resulting optoelectronic apparatuses each includes
    one of the POSDs,
    one of the reflector cups formed from the light reflective molding compound, and
    an optical barrier formed from the opaque molding compound and surrounding a peripheral portion of the one of the reflector cups.

7. The method of claim 5, further comprising, after the molding the light reflective molding compound, and after the molding the opaque molding compound, and either before or after step (c):
    cutting through the opaque molding compound to separate subsets of the POSDs from the other subsets of the POSDs, so that each of a plurality of resulting optoelectronic apparatuses includes one subset of the POSDs;
    wherein each subset of the POSDs comprises at least two POSDs; and
    wherein associated with each of the POSDs within each subset of the POSDs is a corresponding one of the reflector cups formed from the light reflective molding compound; and
    wherein a light barrier formed from the opaque molding compound separates neighboring POSDs within each subset of the POSDs.

8. The method of claim 1, wherein:
    the carrier substrate comprises tape having an adhesive surface;
    step (a) comprises attaching the bottom surfaces of the plurality of POSDs to the adhesive surface of the tape so that there is the space between each POSD and its one or more neighboring POSD(s); and
    step (c) comprises removing the tape so that the electrical contacts on the bottom surfaces of the POSDs are exposed.

9. The method of claim 1, wherein each of the POSDs comprises a packaged light source semiconductor device (PLSSD) that includes one or more light emitting elements.

10. The method of claim 1, wherein at least one of the POSDs comprises a packaged light detector semiconductor device (PLDSD) that include one or more light detecting elements.

11. A method for manufacturing an optoelectronic apparatus that includes one or more packaged optoelectronic semiconductor devices (POSDs), wherein each POSD includes one or more optoelectronic elements encapsulated by a light transmissive molding compound, and wherein each POSD includes a bottom surface including electrical contacts, the method comprising:

(a) attaching the bottom surfaces of the one or more POSDs to a carrier substrate;

(b) molding a light reflective molding compound around a portion each of the one or more POSDs attached to the carrier substrate so that a reflector cup is formed from the light reflective molding compound for each of the one or more POSDs; and (c) removing the carrier substrate so that the electrical contacts on the bottom surfaces of the one or more POSDs are exposed.

12. The method of claim 11, wherein:

the carrier substrate comprises tape having an adhesive surface;

step (a) comprises attaching the bottom surfaces of the one or more POSDs to the adhesive surface of the tape; and step (c) comprises removing the tape so that the electrical contacts on the bottom surfaces of the one or more POSDs are exposed.

13. The method of claim 11, further comprising after step (b) and before step (c):

molding an opaque molding compound around a portion of each molded reflector cup.

14. The method of claim 11, wherein each of the one or more POSDs comprises a packaged light source semiconductor device (PLSSD) that includes one or more light emitting elements.

* * * * *